(12) United States Patent
Wong et al.

(10) Patent No.: US 7,714,427 B2
(45) Date of Patent: May 11, 2010

(54) INTEGRATED CIRCUIT DIE CONFIGURATION FOR PACKAGING

(75) Inventors: Chee Wai Wong, Kuala Lumpur (MY); Chee Hoo Lee, Taiping (MY)

(73) Assignee: Intel Corporation, Santa Clara, CA (US)

( * ) Notice: Subject to any disclaimer, the term of this patent is extended or adjusted under 35 U.S.C. 154(b) by 792 days.

(21) Appl. No.: 11/554,528

(22) Filed: Oct. 30, 2006

(65) Prior Publication Data

US 2007/0057381 A1    Mar. 15, 2007

Related U.S. Application Data

(62) Division of application No. 10/977,157, filed on Oct. 29, 2004, now Pat. No. 7,341,887.

(51) Int. Cl.
*H01L 23/48* (2006.01)
(52) U.S. Cl. .............. 257/693; 257/692; 257/730; 257/786; 257/773; 257/E23.01; 257/E23.07
(58) Field of Classification Search ............. 257/773, 257/723, 730, 786, E23.01, 692, 693, E23.07
See application file for complete search history.

(56) References Cited

U.S. PATENT DOCUMENTS

| | | | |
|---|---|---|---|
| 5,594,626 A | 1/1997 | Rostoker et al. | |
| 5,744,858 A | 4/1998 | Rostoker | |
| 5,753,970 A | 5/1998 | Rostoker | |
| 6,118,670 A | 9/2000 | Radford et al. | |
| 6,303,998 B1 | 10/2001 | Murayama | |
| 6,529,114 B1 | 3/2003 | Bohlinger et al. | |
| 6,531,782 B1 | 3/2003 | Jones et al. | |
| 6,566,980 B2 | 5/2003 | Abott | |
| 6,747,331 B2 | 6/2004 | Infantolino et al. | |
| 7,005,958 B2 | 2/2006 | Wan | |
| 7,026,706 B2* | 4/2006 | Infantolino et al. | 257/678 |
| 7,034,651 B2 | 4/2006 | Bohlinger | |
| 7,064,451 B2* | 6/2006 | Satomi et al. | 257/787 |
| 7,167,936 B2 | 1/2007 | Lindt | |
| 2003/0141957 A1 | 7/2003 | Bohlinger | |
| 2003/0231098 A1 | 12/2003 | Wan | |
| 2004/0120176 A1 | 6/2004 | So et al. | |
| 2004/0155338 A1 | 8/2004 | Shim et al. | |
| 2005/0269701 A1 | 12/2005 | Tsuji et al. | |
| 2006/0094222 A1 | 5/2006 | Wong et al. | |
| 2006/0152332 A1 | 7/2006 | Bohlinger | |
| 2006/0233012 A1 | 10/2006 | Sekiguchi et al. | |

* cited by examiner

*Primary Examiner*—M. Wilczewski
(74) *Attorney, Agent, or Firm*—Blakely, Sokoloff, Taylor & Zafman LLP

(57) ABSTRACT

Integrate circuit die terminal arrangements and configurations for mounting an integrate circuit die on a package substrate to reduce package transmission paths. In one embodiment, terminals for signals sensitive to trace length outside a die are arranged at the corners of the die. The die is mounted on a package substrate in an angle with respect to a package substrate to point the corners of the die at the edges of the package substrate to reduce trace length outside the die. The center of the die may or may not coincide with the center of the substrate. In one embodiment, when compare to a centered, non-rotated die mounting position, mounting a die with corners pointing at the edges of the package substrate does not cause significant differences in substrate warpage.

3 Claims, 10 Drawing Sheets

INTEGRATED CIRCUIT DIE CONFIGURATION FOR PACKAGING

RELATED APPLICATIONS

This application is a divisional application of U.S. application Ser. No. 10/977,157, filed Oct. 29, 2004, now U.S. Pat. No. 7,341,887, currently pending.

FIELD

At least some embodiments of the invention relate to microelectronic design and packaging, and more specifically, to high speed devices.

BACKGROUND

A typical packaged integrated circuit unit includes a die on which the integrated circuit is formed and a package substrate on which the die is mounted on. An interconnect structure connects the terminals of the die from the integrated circuit in the die to the terminals of the package, which can be further connected to other components through a circuit board. The package may be directly mounted on the circuit board, or through a socket or an interposer.

A sophisticated Integrated Circuit (IC) chip such as a microprocessor uses a large number of terminals for connection to a circuit board. Various packaging techniques have been developed to provide the terminals for connection to the circuit board with an increasing number of terminals on a small size package. A grid array type of packaging technique arranges the terminals in a grid array pattern on one side of the package, such as a Pin Grid Array (PGA) package, a Ball Grid Array (BGA) package, a Column Grid Array (CGA) package, or a Land Grid Array (LGA) package. These terminals are typically based on flat pads formed on a dielectric layer of the package. For example, in a land grid array package a solder resist opening defines the land out of a portion of a pad; in a ball/column grid array package a solder ball/column is attached to the pad through a solder resist opening. Other types of terminals, such as pins, can also be used.

When a flip chip packaging technique is used, a die is flipped so that the terminal side of the die faces the substrate and the terminal side of the package. An interconnect structure is typically formed on the substrate to connect the terminals of the die to the terminals of the package. Underfill materials are typically used between the die and the substrate to provide bonding strength and physical protection for the connection between the die and the substrate against external force, moisture, etc.

Mismatch in coefficients of thermal expansion of the die, the underfill and the package substrate can lead to warpage of the package substrate. Typically, the underfill materials are applied at an elevated temperature to fill in the space between the die and the substrate, surrounding the electric connections (e.g., solder connections) between the die and the substrate. When the package is cooled down to a room temperature, differences in thermal expansion in the die, the underfill and the substrate can cause the package to bend toward one side.

BRIEF DESCRIPTION OF THE DRAWINGS

The accompanying drawings illustrate by way of example and not limitation, in which like references indicate similar elements.

DETAILED DESCRIPTION

In the following description, numerous specific details are set forth. However, it is understood that embodiments of the invention may be practiced without these specific details. In other instances, well-known circuits, structures and techniques have not been shown in detail in order to avoid obscuring the understanding of the disclosure. References to one or an embodiment in the present disclosure are not necessarily references to the same embodiment; and, such references mean at least one.

Figure 1:
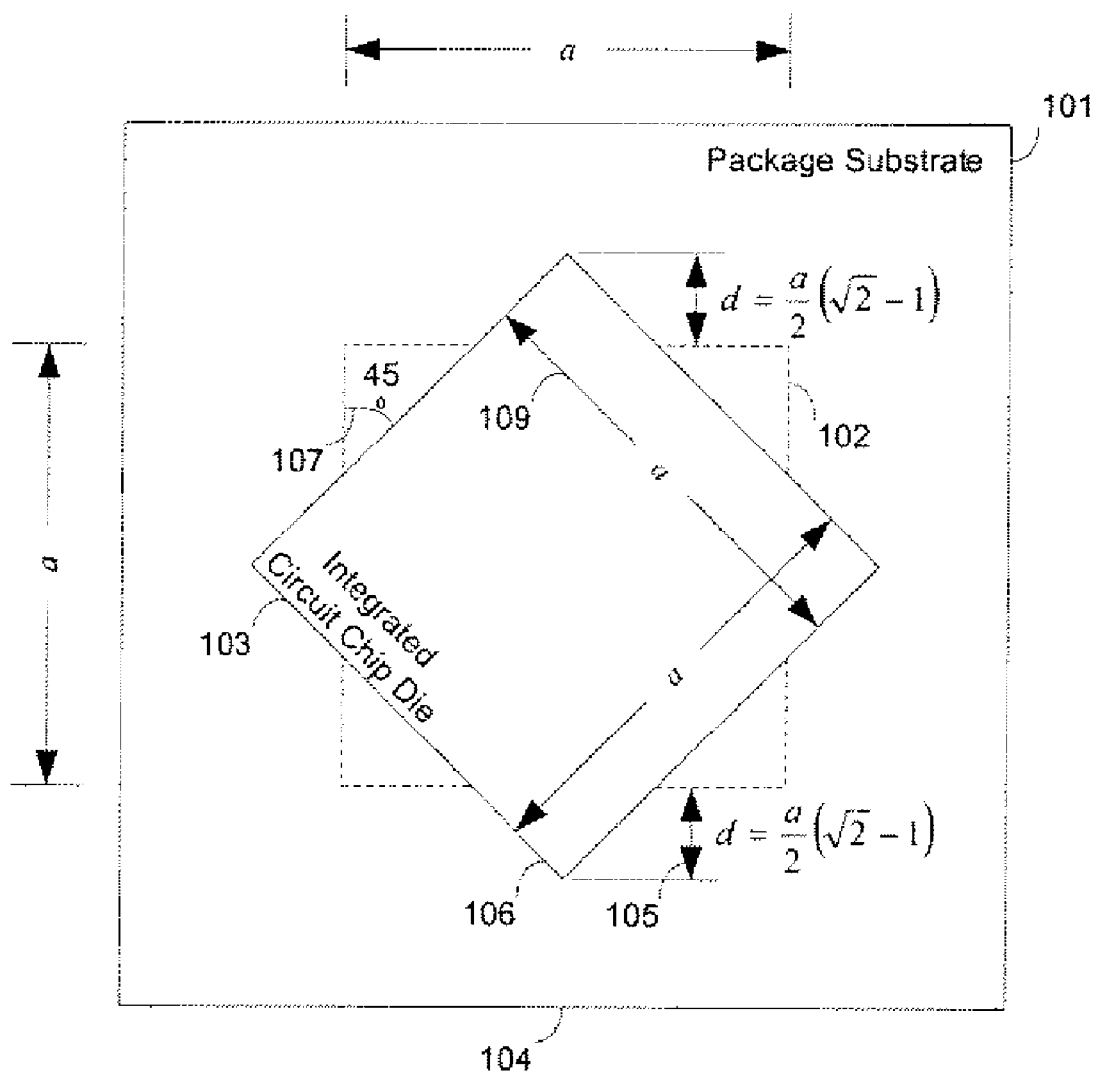
FIG. 1 illustrates a top view of an integrated circuit chip according to one embodiment of the present invention.

FIG. 1 illustrates a top view of an integrated circuit chip according to one embodiment of the present invention. In FIG. 1, an integrated circuit chip die (103) is mounted on a package substrate (101) in an angle (107) (e.g., 45 degrees) with respect to the package substrate. Thus, the corners of the integrated circuit chip die (103) point to the respective edges of the package substrate (101).

In FIG. 1, the diagonal lines of the integrated circuit chip die (103) are parallel to and in alignment with the centerlines of the package substrate (101). The center of the integrated circuit chip die (103) is on the center of the package substrate (101). The edges of the integrated circuit chip die and the edges of the package substrate are in an angle of 45 degrees.

In the example of FIG. 1, the integrated circuit chip die (103) has an overall shape of a square. The length of the edges of the square is a (see, e.g., the distance 109). Thus, the diagonal length of the integrated circuit chip die is a√2.

In a typical packaging configuration (102), the die is not rotated with respect to the substrate and mounted at the center of the substrate; the edges of the die are parallel to the corresponding edges of the substrate; and the corners of the die point to the corresponding corners of the substrate. When compared to the typical configuration (102), the corners of the integrated circuit chip die (103) are closer to the corresponding edges of the package substrate (101) pointed at by the corresponding corners.

For example, in FIG. 1, the points in the corner (106) is up to a distance (105) of d=a(√2−1)/2~0.2a shorter to the lower edge (104) pointed at by the corner (106) than points in the typical configuration (102).

In one embodiment of the present invention, the terminals of high speed signals are arranged at the corners of the die so that, when a die is mounted on a substrate in a rotated configuration as illustrated in FIG. 1, the terminals for the high speed signals have shorter package transmission paths than a typical non-rotated centered configuration (e.g., 102). Thus, the terminals and die placement configuration can reduce transmission loss and increase the package electrical performance.

In FIG. 1, when the integrated circuit chip die (103) is in an angle with respect to the package substrate (101), the integrated circuit chip die (103) has four corner areas which are outside the area that would be occupied by the die in the non-rotated configuration (102). These corner areas have reduced distances to package substrate edges. In one embodiment of the present invention, terminals for signals that are sensitive to trace lengths (e.g., for high speed signals) are designed to be at these corner areas so that the lengths for the traces outside the die can be reduced for the these signals.

For example, when a terminal is placed at a corner area, trace distance from the terminal on the die to the edge of the package substrate pointed at by the corner can be reduced by up to approximately 0.2a (see, e.g., distance 105).

In one embodiment, the signals from the die are routed through the interconnect structure on the package substrate to the terminals of the package, to the circuit board and to the region outside the area of the package substrate in the top view The reduction in the distance between the points on the die to the edges of the packages corresponds to the reduction in package transmission path and corresponds to the reduction in trace length outside the die for connecting the signals to other components in the circuit board.

As shown in FIG. 1, the integrated circuit chip die (103) provides four corners for placing die terminals that are closer to the four different edges of the package substrate (101) than the typical configuration (102). Thus, terminals for high speed signals to be routed toward different directions can be placed in the corresponding die corners that point to the corresponding directions.

In one embodiment, mounting a die in an angle with respect to a substrate does not significantly change the warpage of the package. In one example, the overall warpage of a package as illustrated in FIG. 1 is substantially the same as the overall warpage of a traditional package where the die is in the typical configuration (102) and is not in an angle with respect to the substrate.

In one example of an embodiment, the package and die sizes are 37.5×37.5 mm and 12×12 mm respectively. The substrate warpage of the typically non-rotated die mounting configuration is about 105.1 microns and 103.6 microns for a 45-degree rotated die mounting configuration. Thus, there is insignificant difference in substrate warpage between a typical non-rotated die mounting configuration and a 45-degree rotated die mounting configuration.

An alternatively embodiment, the warpage of the package can be significantly reduced through mounting the die in an angle with respect to the substrate. For example, when the substrate is of a flexible material, such as an organic material, mounting the die in an angle with respect to the substrate can significantly reduce overall warpage.

Figure 2:
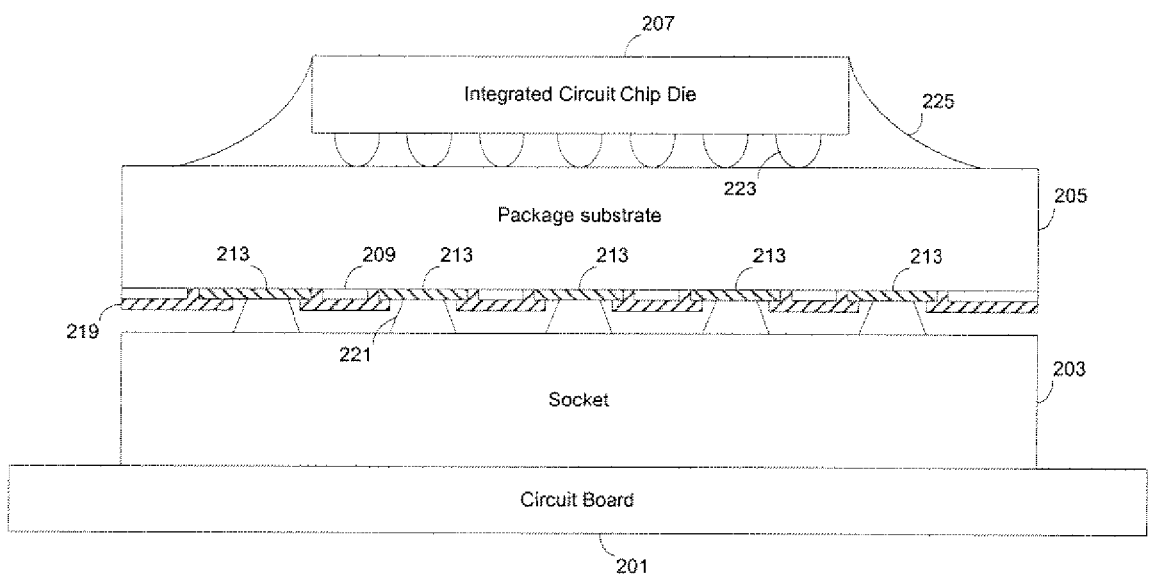
FIG. 2 illustrates a cross section view of an integrated circuit chip mounted on a circuit board according to one embodiment of the present invention.

FIG. 2 illustrates a cross section view of an integrated circuit chip mounted on a circuit board according to one embodiment of the present invention.

In FIG. 2, an integrated circuit chip die (207) is mounted on the package substrate (205), which typically has metal traces and vias to connect the integrated circuit to pads (213) of the package. The pads (213) are formed on a dielectric layer of the substrate (205) and covered with a solder resist layer (219). The solder resist layer (219) has a grid array of solder resist openings to define lands out of the pads of the land grid array package.

In one embodiment, the integrated circuit chip die (207) is flipped so that the terminal side faces the package substrate (205) and the package terminals, such as the lands (213) of the packages. The integrated circuit chip die (207) is electrically connected to the interconnect structure in the substrate (205) through solder balls (e.g., 223). The underfill (225) protects the solder ball connection between the integrated circuit chip die and the package substrate (205).

In one embodiment, the terminals of the integrated circuit chip die (207) are arranged in an array; and a grid array of solder balls (e.g., 223) is typically used to electrically connect the integrated circuit through the die terminals to the package substrate (205).

In one embodiment, the underfill (225) is thermally curable. Mismatch in coefficients of thermal expansion and curing the underfill material at an elevated temperature can cause warpage at a room temperature. In one embodiment of the present invention, the overall warpage in the substrate is substantially the same regardless of the angle of the integrated circuit chip die with respect to the package substrate in the top view.

A socket (203) is used to mount the package on the circuit board (201). The socket has contacts (e.g., 221) to contact the lands of the land grid array package and make electric connections to the circuit on the circuit board (201). The contacts (e.g., 221) and the socket (203) may use bunched wire, metal particles in polymer, metal wires in polymer, or stamped metal springs or contact pins.

The circuit board (201) further connects the terminals of the package, such as lands (213), to other components (not shown in FIG. 2) mounted on the circuit board (201).

FIG. 2 illustrates an example of a land grid array package. Similar configurations can also be used with other types of package techniques. For example, the socket (203) and contacts (e.g., 221) may be replaced with solder balls in a bail grid array type of package, or solder columns in a column grid array type of package or pins in a pin grid array type of package. Further, the integrated circuit chip die (207) may be connected to package substrate (205) through an array of pins.

Figure 3:
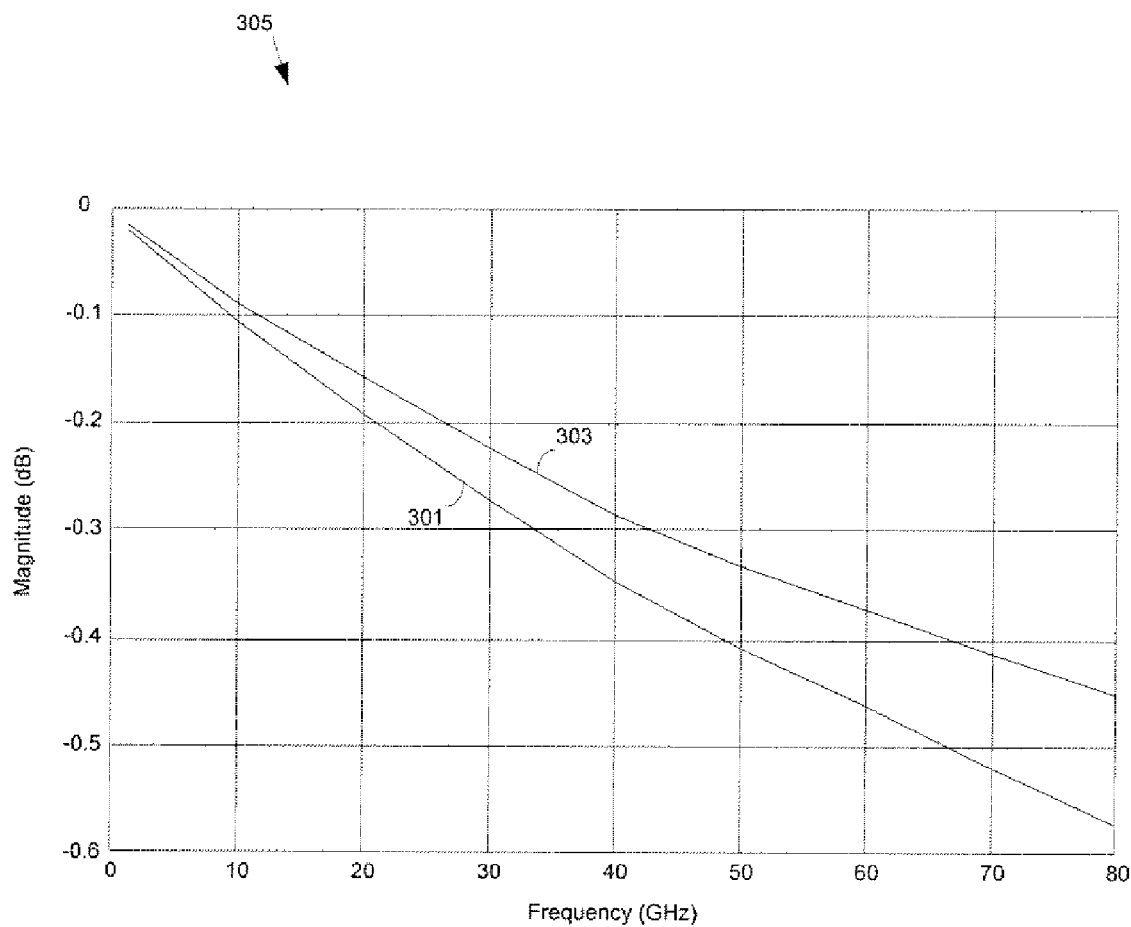
FIG. 3 illustrates an insertion loss plot for different trace lengths for an integrated circuit chip according to one embodiment of the present invention.

FIG. 3 illustrates an insertion loss plot for different trace lengths for an integrated circuit chip according to one embodiment of the present invention. In one embodiment of the present invention, some terminal signals (e.g., input/output signals) of a die are sensitive to the trace lengths outside the die. Reducing the length of a package transmission path can significantly reduce the transmission loss and improve package electrical performance for high speed operations.

In FIG. 3, a first curve (301) shows the signal degradation caused by a 2.0 mm microstrip as the frequency increases. A second curve (303) shows the signal degradation caused by a 1.5 mm microstrip as the frequency increases. It is seen that reducing the trace length can significantly improve the signal, especially when the signal is operated at a high frequency (e.g., higher than 20 GHz). As the input/output frequency scaling higher, reducing the transmission path in the interconnect structure can be increasingly effective in reducing the loss associated with transmission line effect and providing better electrical performance.

One embodiment of the present invention adjusts the orientation and/or the position of the die with respect to the substrate and adjusts the location of the terminals on the die to reduce the package transmission paths.

Figure 4:
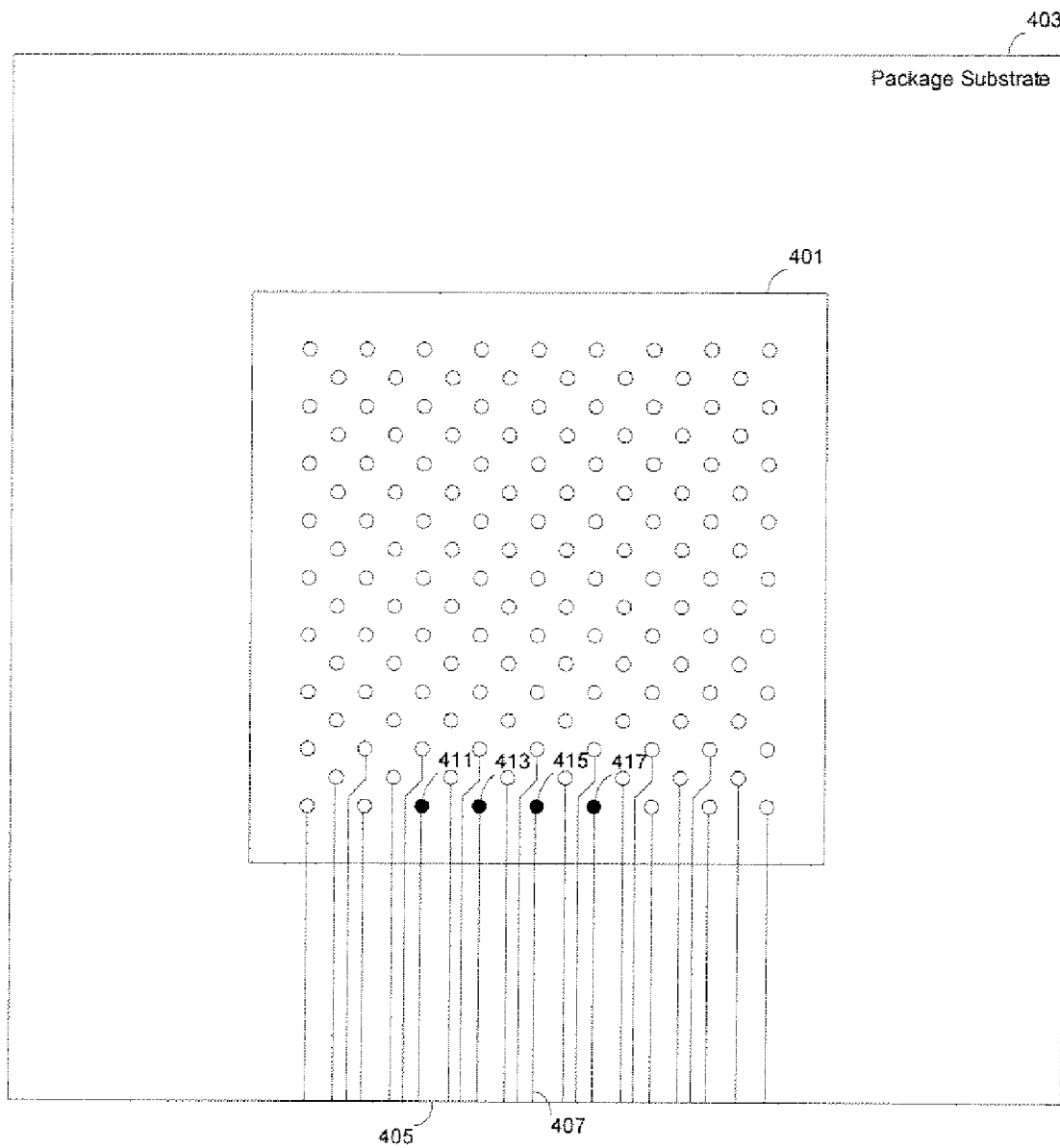
FIGS. 4-5 illustrate a method to reduce trace lengths for terminal signals according to one embodiment of the present invention.
Figure 5:
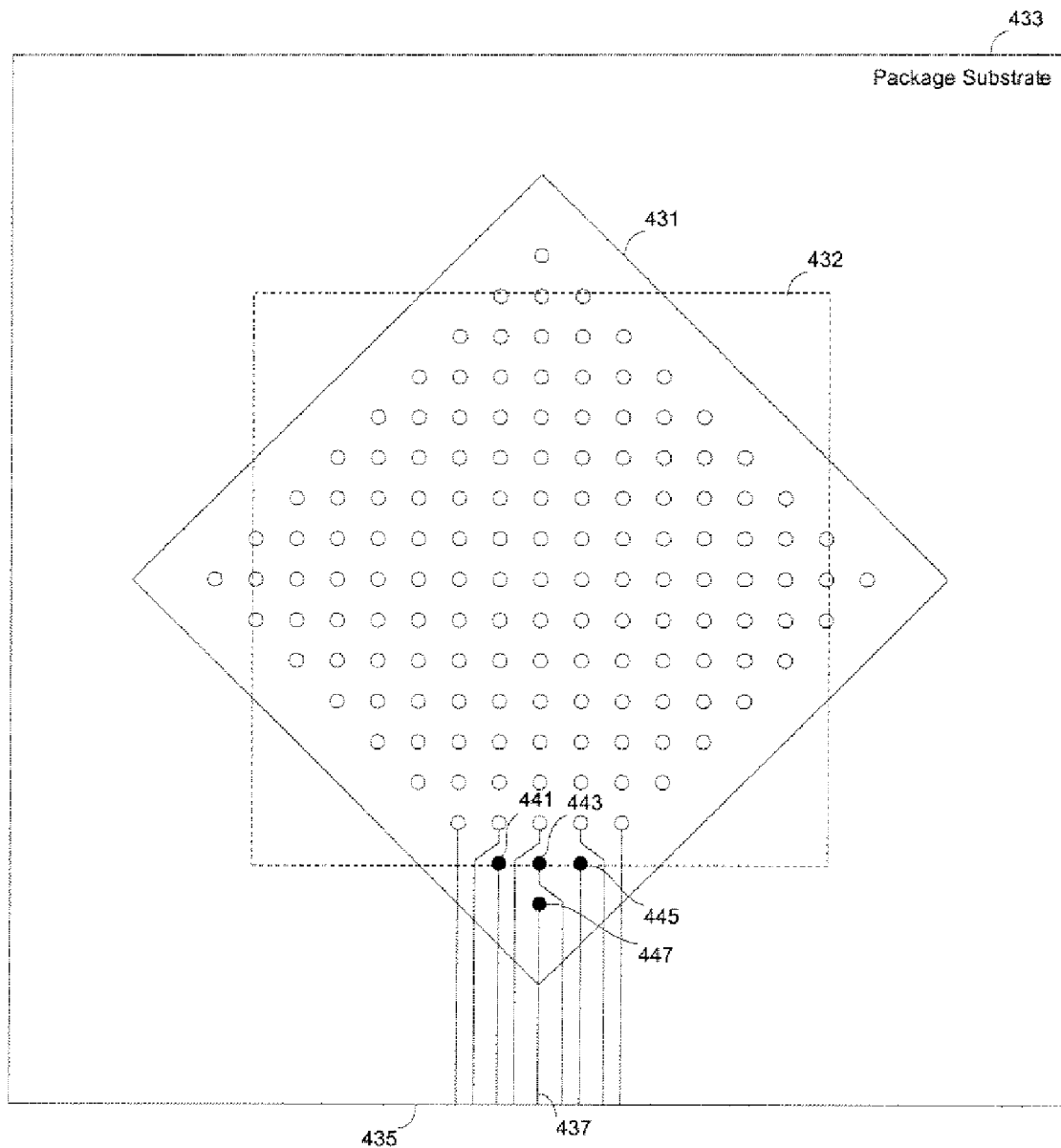

FIGS. 4-5 illustrate a method to reduce trace lengths for terminal signals according to one embodiment of the present invention. In FIG. 4, the die (401) is on the package substrate (403) in a non-rotated configuration.

In the configuration of FIG. 4, the terminals (e.g., 411, 413, 415 and 417) for the high speed signals which are sensitive to the trace distances are arranged near the edge of the die (401) so that these terminals are close to the edge (405) of the package substrate (403). The signals are generally routed to a region outside the package in a top view through the traces (and vias) of the interconnect structure in the package substrate (403), the terminals of the package and circuit board traces.

For example, in FIG. 4, the signal from terminal (415) is routed in a way illustrated by the line (407) to the region outside the package. The line (407) generally represents a portion of the interconnect traces and vias in the interconnect structure in the package substrate (403), the terminals of the package and circuit board traces. The line (407) in FIG. 4 generally illustrates the trace outside the die routed in the direction toward the edge of the package substrate. In general, it is understood that the trace(s) may or may not be straight and may correspond different components of the circuitry. The line (407) in FIG. 4 is used to illustrate the distance in the direction toward the edge of the package.

In FIG. 4, the circles represent the terminals on the die. The filled circles (e.g., 411-417) represent terminals for high speed signals (or signals that are sensitive to trace distances outside the die); and the hollow circles represent terminals for other signals. In FIG. 4, only a portion of the traces from the terminals of the die is illustrated. The die terminals are typically arranged in a grid array, with more or less terminals for different integrated circuit chips. Such an illustration scheme is also used in FIGS. 5-7.

FIG. 5 illustrates an arrangement according to one embodiment of the present invention. In FIG. 5, the terminals (e.g., 441, 443, 445 and 447) for the high speed signals that are sensitive to the trace distances are arranged in a corner of the die (431). The die is rotated to point the corner at the edge (435) of the package substrate (433) so that the package transmission paths for the corner terminals can be reduced. In the rotated position the corner with the terminals (441-447) are closer to the edge (435) of the package substrate (433) than any terminals of the un-rotated die (401) of FIG. 4 to the corresponding edge (405). Thus, the configuration illustrated in FIG. 5 provides reduced trace lengths for the terminals arranged at the corner of the die (431).

In FIG. 5, the position (432) corresponds to the boundary of the un-rotated die (401) of FIG. 4. Since there is a distance between the edges of the die and the bounding box of the terminals, it is understood that the terminals (441-447) at the corner of the rotated die (431) in FIG. 5 are outside the corresponding bounding box (not shown in FIG. 5) of the terminals of the un-rotated die (401).

FIGS. 6-9 illustrate configurations to reduce package transmission paths from die terminals according embodiments of the present invention.

Figure 6:
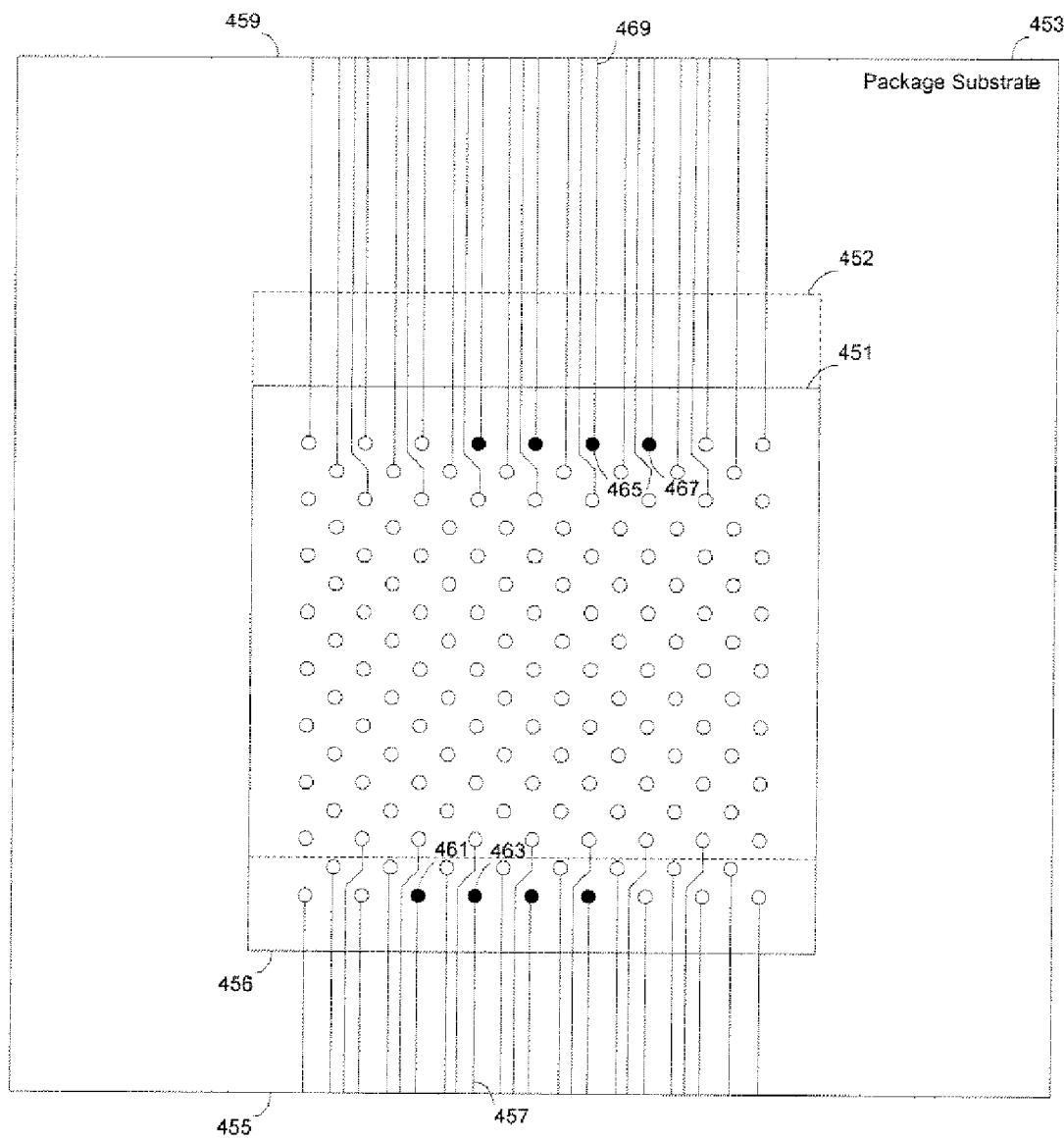
FIGS. 6-9 illustrate configurations to reduce package transmission paths from die terminals according embodiments of the present invention.

FIG. 6 illustrates an arrangement to reduce trace lengths for some high speed signals without rotating the die. In FIG. 6, the die (451) is mounted on the package substrate (453) a distance way from the center of the package substrate. In FIG. 6, the die (451) is shifted toward the lower edge (455) of the package substrate (453) from the centered position (452) so that the lower edge (456) of the die (451) is closer to the lower edge (455) of the package substrate (453). The trace distances for the high speed signals (or signals that are sensitive to trace distances outside the die) from the terminals (e.g., 461, 463) near the lower edge (456) of the die are reduced, as illustrated by the trace (457) from the terminal (463).

However, in FIG. 6, after the die (451) is shifted down toward the lower edge (455) of the substrate, the trace distances for terminals in the upper portion of the die (451) are increased. For example, the trace lengths for terminals (465 and 467) toward the upper edge (459) of the package substrate (453) are increased, as illustrated by the trace (469) from the terminal (465).

Thus, offsetting the die from the center position on the package substrate in a way as illustrated in FIG. 6 can be used to reduce the trace length for die terminals near one edge of the die (or two adjacent edges by offsetting in both directions) but not effective to reduce trace lengths from terminals near two opposite edges of the die toward two corresponding opposite edges of the package substrate.

Figure 7:
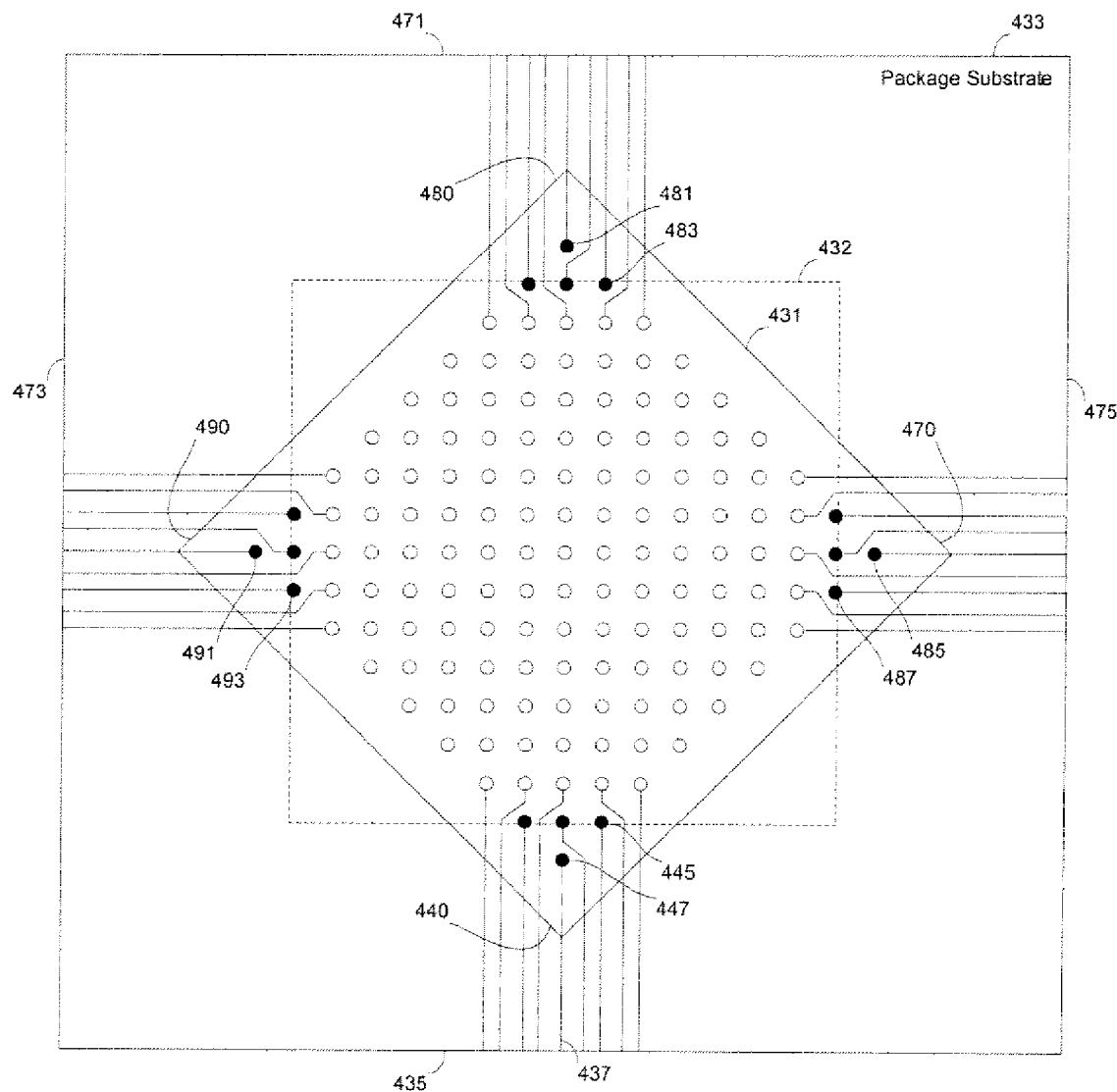

FIG. 7 illustrates an arrangement in which the trace lengths can be reduced for signals routed toward opposite edges of the package substrate. In one embodiment of the present invention, as illustrated in FIG. 7, the terminals for signals to be routed toward different edges (435, 471, 473, 475) of the package substrate (433) are placed at different corners (440, 480, 470, 490) of the die (431). The die (431) is mounted on the package substrate (433) in an angle so that the corners (440, 480, 470, 490) point to the corresponding edges (435, 471, 473, 475) of the package substrate (433). Thus, when compared to the centered, non-rotated die position (432), trace lengths from terminals at the corners toward the corresponding edges of the package substrate can be reduced. For example, the transmission paths from terminals 445 and 447 at the corner (440) toward the lower edge (435), from terminals 481 and 483 at the corner (480) toward the upper edge (471), from terminals 491 and 493 at the corner (490) toward the left edge (473), from terminals 485 and 487 at the corner (470) toward the lower edge (475) are reduced.

When compared to the arrangement in FIG. 6, the rotated die position illustrated in FIG. 7 can accommodate the need to reduce package transmission paths from terminals toward opposite edges of the package substrate. When the arrangement of FIG. 6 is used, the high speed signals (or signals that are sensitive to trace distances outside the die) will be routed from one side or two adjacent sides of the package, which may cause the concentration of high speed signals at one side or two adjacent sides of the package. Further, offsetting the die in a way illustrated in FIG. 6 may significantly increase the overall warpage. When the arrangement of FIG. 7 is used, the high speed signals (or signals that are sensitive to trace distances outside the die) can be distributed to two opposite sides or all sides of the package.

In general, the die and the substrate can have other overall shapes, such as rectangles. The die can be mounted in an angle different from 45 degrees with respect to the substrate. Further, the die can be offset from the center of the package substrate.

Figure 8:
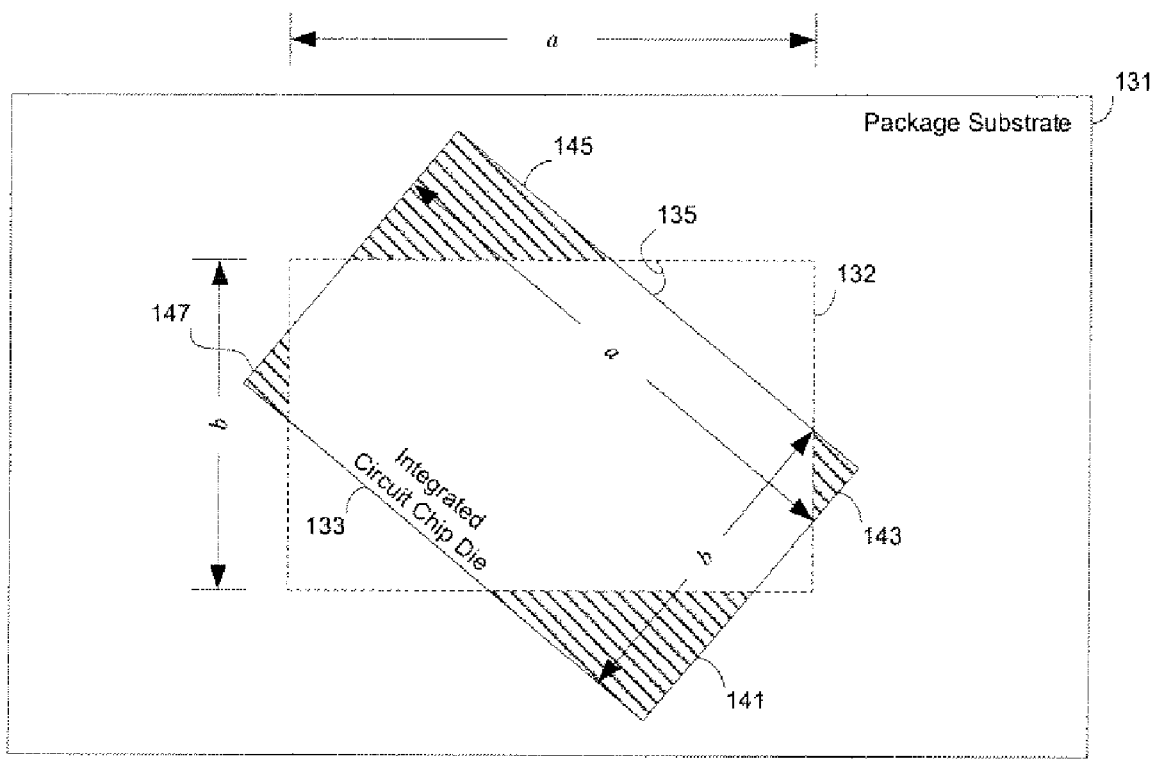

For example, in FIG. 8, the integrated circuit chip die (133) is in an angle θ (135) with respect to the centered position (132). The angle θ (135) is neither zero nor ninety degrees. The angle θ can be changed to adjust the areas of the corners (141, 143, 145, 147) that are outside the centered position (132).

It is understood that there is generally a distance between the boundary of a die and the outmost row of terminals. A bounding box of the die terminal array is typically proportional to the boundary of the die. To better illustrate the areas of the terminals, the centered position (132) and the box for the integrated circuit chip die (133) can be considered as illustrating the bounding box of the arrays of die terminals. For example, in FIG. 8, the bounding box of the arrays of die terminals has a rectangle shape with a length a and a width b.

In FIG. 8, the terminals placed in the shaded areas of the corners (141, 143, 145, 147) have reduced trace lengths toward the corresponding edges of the package substrate (131) pointed at by the corresponding corners. Thus, in one embodiment, the terminals for high speed signals (or signals that are sensitive to trace distances outside the die) are placed inside these areas.

Further, the angle θ can be adjusted so that the corners can point at different portions of the edges. In general, the corners point at middle portions of the edges so that the traces lengths between the corresponding middle portions and the corners are reduced. The angle θ can be adjusted to point one or more corners at the center of one or more edges of the substrate or off the center of the edges of the substrate.

Figure 9:
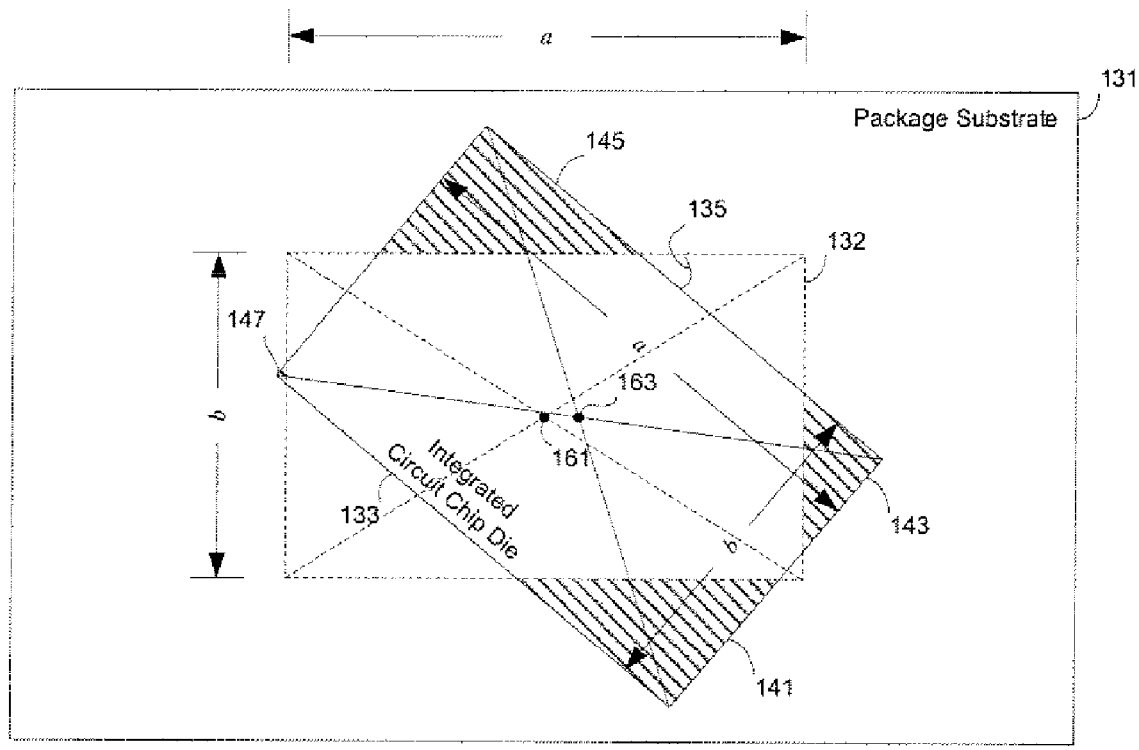

In the top view of FIG. 8, the center of the integrated circuit chip die (133) coincides with the center of the package substrate (131). FIG. 9 illustrates an arrangement where the center (163) of the integrated circuit chip die (133) is a distance away from the center (161) of the package substrate (131) and the integrated circuit chip die (133) is in an angle θ (135) with respect to the package substrate (131). When the center (161) of the integrated circuit chip die (133) is a distance away from the center (163) of the package substrate (131), the sizes of the corner areas (141, 143, 145, 147) that are outside the centered, non-rotated position (132) are changed. Thus, adjusting the amount of offset changes the sizes of corner areas that can be used to reduce the package transmission paths, which can be used to accommodate the different numbers of terminals for high speed signals (or signals that are sensitive to trace distances outside the die) to be routed toward different edges of the package substrate (131).

Figure 10:
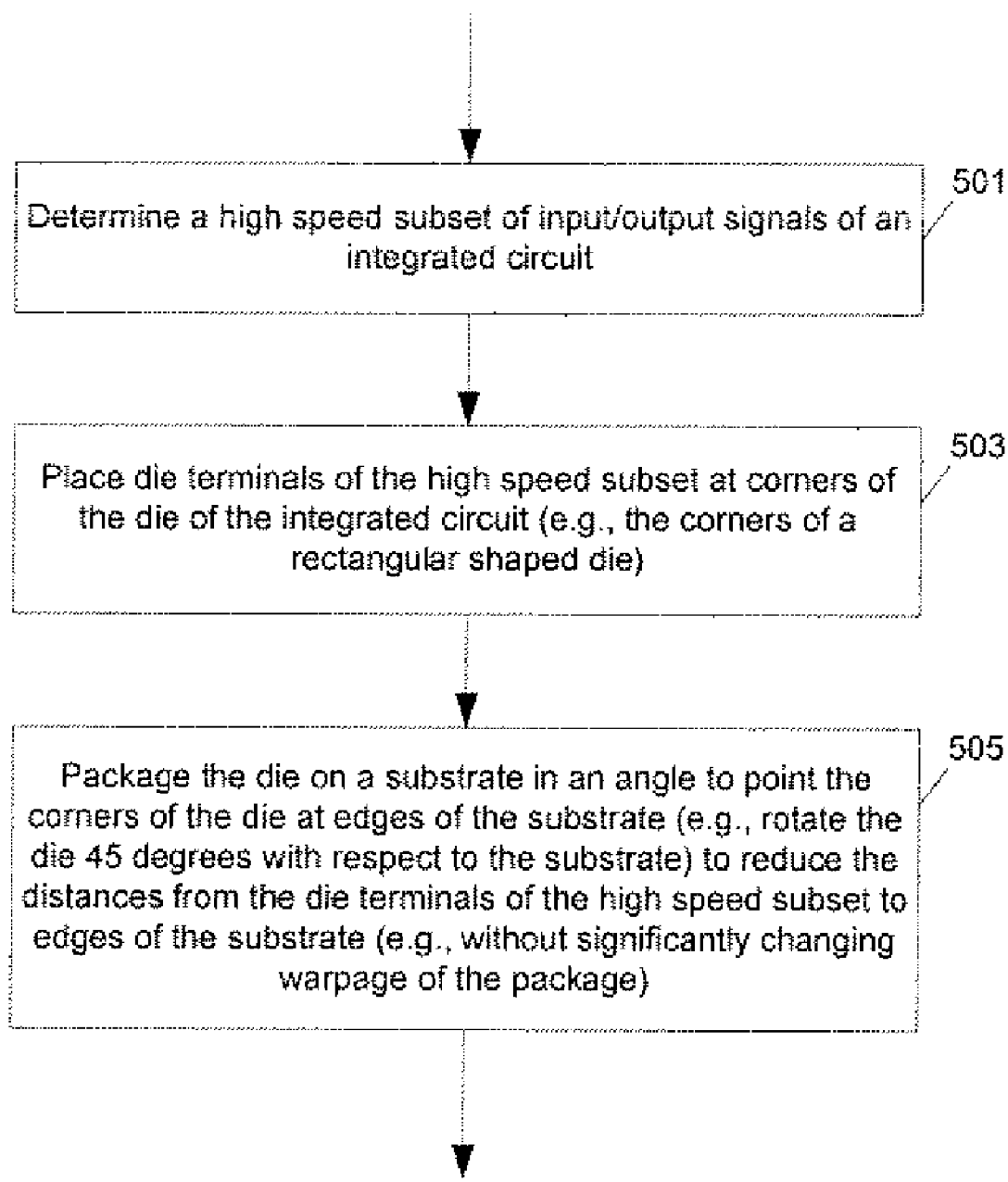
FIG. 10 illustrates a method to produce a high speed device according to one embodiment of the present invention.

FIG. 10 illustrates a method to produce a high speed device according to one embodiment of the present invention. Operation 501 determines a high speed subset of input/output signals of an integrated circuit. Operation 503 places die terminals of the high speed subset at corners of the die of the integrated circuit (e.g., the corners of a rectangular shaped die). Thus, these die terminals are arranged at the corners of the bounding box for the terminal array of the die. Operation 505 packages the die on a substrate in all angle to point the corners of the die at edges of the substrate (e.g., rotate the die 45 degrees with respect to the substrate) to reduce the distances from the die terminals of the high speed subset to edges of the substrate (e.g., without significantly changing warpage of the package).

In the foregoing specification, specific exemplary embodiments have been described. It will be evident that various modifications may be made thereto without departing from the broader spirit and scope of the disclosure. The specification and drawings are, accordingly, to be regarded in an illustrative sense rather than a restrictive sense.

What is claimed is:

1. An apparatus comprising:
   a circuit board;
   a plurality of components mounted on the circuit board; and
   an integrated circuit unit mounted on the circuit board, the integrated circuit unit comprising:
   a package substrate; and
   a die mounted on the package substrate, the die having an integrated circuit and a plurality of terminals for a plurality of input/output signals of an integrated circuit, the plurality of input/output signals comprising a portion of signals sensitive to trace distance outside the die, the die having a plurality of corners, a subset of the plurality of terminals in the plurality of corners to connect the portion of signals from the die to the circuit board to the plurality of components in directions pointed at by the plurality of corners respectively, the plurality of corners to point at center portions of overall edges of the package substrate;
   wherein the plurality of components are mounted on the circuit board outside the region of the package substrate.

2. The apparatus of claim 1, wherein the die is square; and the subset is distributed on four corner of the die.

3. The apparatus of claim 2, wherein a center of the die coincides with a center of the package substrate.

* * * * *